(12) United States Patent
Kawahara et al.

(10) Patent No.: US 7,569,402 B2
(45) Date of Patent: Aug. 4, 2009

(54) CHIP DATA PROVIDING SYSTEM AND CHIP DATA PROVIDING SERVER USED THEREFORE

(75) Inventors: Kunihiro Kawahara, Sakata (JP); Kazuya Saito, Yamagata-ken (JP)

(73) Assignee: Seiko Epson Corporation (JP)

( * ) Notice: Subject to any disclaimer, the term of this patent is extended or adjusted under 35 U.S.C. 154(b) by 940 days.

(21) Appl. No.: 10/969,323

(22) Filed: Oct. 20, 2004

(65) Prior Publication Data
US 2005/0148103 A1    Jul. 7, 2005

(30) Foreign Application Priority Data
Oct. 21, 2003    (JP)    ............... 2003-360749

(51) Int. Cl.
H01L 21/00    (2006.01)
G06F 19/00    (2006.01)

(52) U.S. Cl. .......................................... 438/5; 700/121
(58) Field of Classification Search ............... 438/1, 438/5, 14; 700/121
See application file for complete search history.

(56) References Cited

U.S. PATENT DOCUMENTS 5,751,581 A * 5/1998 Tau et al. .................... 700/115
6,097,889 A * 8/2000 Tarrab et al. .................... 712/1
6,438,441 B1 * 8/2002 Jang et al. .................... 700/121
6,775,819 B1 * 8/2004 Hardikar et al. .............. 717/105
7,093,207 B1 * 8/2006 Liao et al. ....................... 716/1
7,395,131 B2 * 7/2008 Funk ........................... 700/108
2003/0135295 A1 * 7/2003 Dor et al. ..................... 700/108
2005/0034039 A1 * 2/2005 Prasadh et al. .............. 714/727
2006/0050950 A1 * 3/2006 Tai et al. ...................... 382/145

FOREIGN PATENT DOCUMENTS

JP    07-335510    12/1995
JP    2003-092239    3/2003

* cited by examiner

Primary Examiner—W. David Coleman
(74) Attorney, Agent, or Firm—Harness, Dickey & Pierce, P.L.C.

(57) ABSTRACT

A chip data providing system is provided. The chip data providing system is equipped with an inspection device for inspecting each chip after processing steps of forming integrated circuits on a plurality chips included in a semiconductor wafer are completed, an inspection server that generates, based on an inspection result, first chip data including information concerning the inspection result of each of the chips, and a chip data providing server that generates, based on the first chip data generated by the inspection server and information concerning an assembly enterprise stored in advance, second chip data in a format suitable for a system of the assembly enterprise that selects and uses the plurality of chips included in the semiconductor wafer, and provides the second chip data to the assembly enterprise.

17 Claims, 6 Drawing Sheets

| MODEL NAME | CHIP NAME | LOT NO. | SEMICONDUCTOR WAFER NO. | X COORDINATE | Y COORDINATE | CATEGORY |
|---|---|---|---|---|---|---|
| A10 | 1 | 001 | 01 | 01 | 01 | 22 |
| A20 | 1 | 001 | 01 | 01 | 02 | 05 |
| ⋮ | ⋮ | ⋮ | ⋮ | ⋮ | ⋮ | ⋮ |
| A10 | 2 | 001 | 02 | 01 | 01 | 11 |
| ⋮ | ⋮ | ⋮ | ⋮ | ⋮ | ⋮ | ⋮ |
| B10 | 1 | 002 | 01 | 01 | 01 | 00 |
| B20 | 1 | 002 | 01 | 01 | 02 | 14 |
| ⋮ | ⋮ | ⋮ | ⋮ | ⋮ | ⋮ | ⋮ |

| NAME OF ASSEMBLY ENTERPRISE | MODEL NAME |
|---|---|
| A | A10 |
| A | A20 |
| B | B10 |
| B | B20 |
| ⋮ | ⋮ |

CHIP DATA PROVIDING SYSTEM AND CHIP DATA PROVIDING SERVER USED THEREFORE

RELATED APPLICATIONS

This application claims priority to Japanese Patent Application No. 2003-360749 filed Oct. 21, 2003 which is hereby expressly incorporated by reference herein in its entirety.

BACKGROUND

1. Technical Field

The present invention relates to a chip data providing system used where an inspection enterprise inspects chips, and provides chip data representative of the quality of each of the chips to indicate whether each of the chips is good or defective to assembly enterprises that assemble semiconductor integrated circuits using the chips that have completed inspection, and to a chip data providing server used therefore.

2. Related Art

Figure 6:
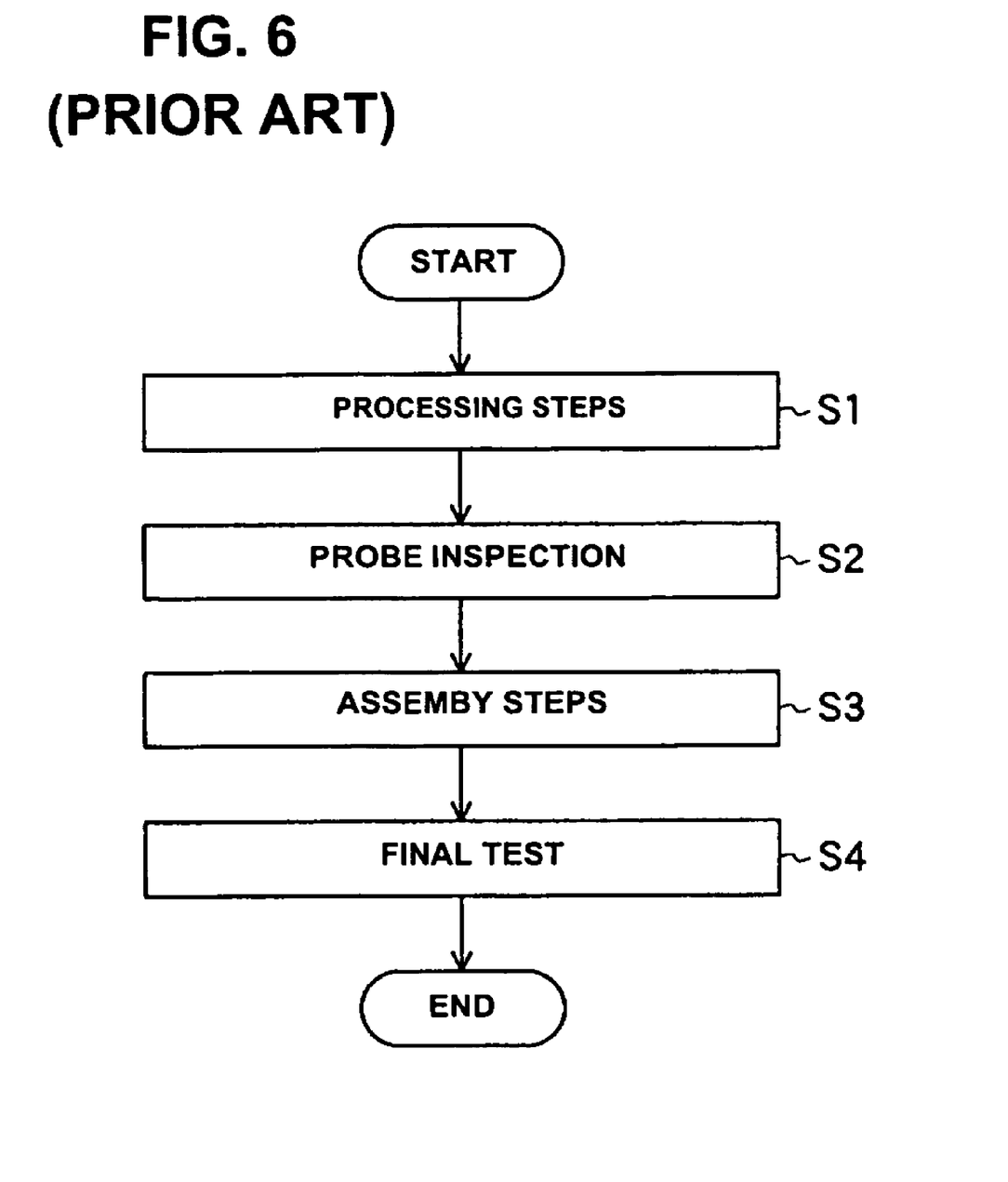
FIG. 6 is a diagram showing a conventional production process of semiconductor integrated circuits.

A conventional production process of semiconductor integrated circuits is shown in FIG. 6. As shown in FIG. 6, in the production of semiconductor integrated circuits, first, pre-processing, such as, epitaxial growth, channel formation, electrode formation, and the like (processing steps) with a semiconductor wafer are conducted in step S1. Next, a probe inspection is conducted in step S2 by using probes to check whether each chip formed on the semiconductor wafer is good or defective.

When the probe inspection is completed, in step S3, the semiconductor wafer is divided in each chip, and post-processing (assembly steps), such as, a die bonding process, wire bonding process, sealing process, and the like are conducted to the chips of good quality. In addition, in step S4, a final test is conducted to finally inspect whether each of the assembled semiconductor integrated circuits is good or defective.

According to a method conventionally used, ink is coated on chips of defective quality in the probe inspection of step S2, and an apparatus in the assembly steps in step S3 reads whether or not ink is coated on the chips, and good quality chips that are not coated with ink are retrieved. However, the method of coating ink on chips of defective quality is costly because it uses ink, and, in addition, needs time to dry the ink. Accordingly, at present, another method is used wherein, in the probe inspection in step S2, instead of coating ink, chip data indicating the quality of each of the chips is generated, and good quality chips are retrieved based on the chip data in the assembly steps in step S3.

However, when the assembly enterprise that assembles semiconductor integrated circuits is a different enterprise from the inspection enterprise that conducts the probe inspection on the chips, chip data is provided by using e-mail, fax, or the like among the person in charge in the inspection enterprise and the person in charge in the assembly enterprise, and therefore only the specific person in charge who receives the e-mail, the fax or the like can understand the information concerning the quality. In particular, when personnel changes, such as, changes of the person in charge frequently take place, the necessity for succeeding the management of chip data takes place. In addition, when there are multiple assembly enterprises, and the chip data formats in the assembly enterprises are different from one another, there is a problem in that errors can easily occur when the chip data is generated.

As a related technology, Japanese Laid-open Patent Application 2003-92239 (Pages 1 and 3, FIG. 1) describes a production system of semiconductor products which can more securely maintain or improve the yield of products. According to the production system of semiconductor products, the yield of products can be more securely maintained or improved by timely obtaining inspection data. However, the document does not describe a probe inspection step to inspect whether each chip formed on a semiconductor wafer is good or defective by using probes, or chip data that indicates the quality of each chip.

In view of the above-described problems, it is an object of the present invention to provide a chip data providing system in which, even when an inspection enterprise and an assembly enterprise are different enterprises, and, in addition, there are a plurality of assembly enterprises, chip data representing the quality of each chip can be smoothly provided to the assembly enterprises, and a chip data providing server used therefore.

SUMMARY

To solve the problems described above, a chip data providing system in accordance with the present invention is equipped with an inspection section that inspects each chip after forming integrated circuits on a plurality chips included in a semiconductor wafer; an inspection server that generates, based on an inspection result of each of the chips provided by the inspection section, first chip data including information concerning the inspection result of each of the chips; and a chip data providing server that generates, based on the first chip data generated by the inspection server and information concerning an assembly enterprise stored in advance, second chip data in a format suitable to a system of the assembly enterprise that selects and uses the plurality of chips included in the semiconductor wafer, and provides the second chip data to the assembly enterprise.

The chip data providing server may generate second chip data in formats suitable to systems of a plurality of assembly enterprises, and may classify and manage the second chip data by the plurality of assembly enterprises. Also, the chip data providing system may further be equipped with an encryption section that renders encryption processing to the second chip data generated by the chip data providing server.

A chip data providing server in accordance with the present invention is equipped with: a data load section that loads first chip data including information concerning an inspection result of each chip provided by an inspection conducted after completing the processing steps to form integrated circuits in a plurality of chips included in a semiconductor wafer; a first database that stores first chip data loaded by the data load section; a second database that stores information concerning an assembly enterprise that selects and uses a plurality of chips included in the semiconductor wafer; a data generation section that generates, based on the first chip data stored in the first database and the information concerning an assembly enterprise stored the second database, second chip data in a format suitable to a system of the assembly enterprise that selects and uses a plurality of chips included in the semiconductor wafer; and a data transfer processing section that performs a process to transfer the second chip data generated by the data generation section.

The chip data providing server may generate second chip data in formats suitable to the systems of a plurality of assembly enterprises, and may classify and manage the second chip data by the plurality of assembly enterprises. Also, the data load section may store, in the first database, a model name on which each of the chips is mounted, a lot number and a wafer number concerning each of the chips, coordinates of the good chips, and the number of good chips, as the first chip data.

Furthermore, the second database may store relations between assembly enterprises and model names on which each of the chips is mounted. Also, the data generation section may generate the name of the assembly enterprise, model names on which each of the chips is mounted, a lot number and a wafer number concerning each of the chips, coordinates of the good chips, and the number of good chips, as the second chip data.

In accordance with the present invention, even when an inspection enterprise and an assembly enterprise are different enterprises, and, in addition, there are a plurality of assembly enterprises, chip data representing the quality of each chip can be smoothly provided to the assembly enterprises.

BRIEF DESCRIPTION OF THE DRAWINGS

FIGS. 3(A) and (B) are diagrams for explaining chip data.

DETAILED DESCRIPTION

Embodiments of the present invention in their best mode are described below in detail with reference to the accompanying drawings. It is noted that the same elements are identified with the same reference numbers, and their description is not duplicated.

Figure 1:
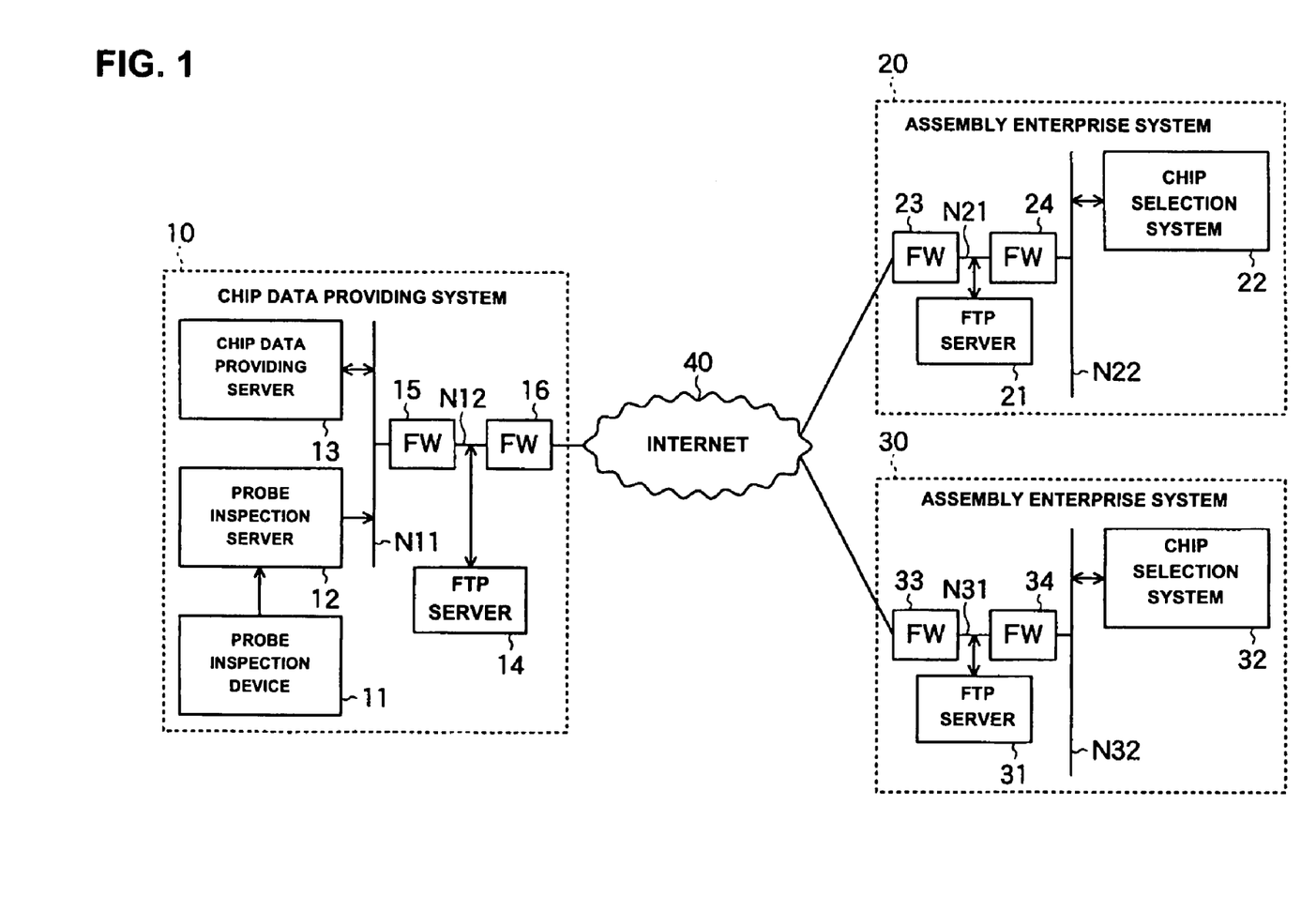
FIG. 1 is a diagram showing a semiconductor integrated circuit production system that includes a chip data providing system in accordance with an embodiment of the present invention.

FIG. 1 shows a semiconductor integrated circuit production system that includes a chip data providing system in accordance with an embodiment of the present invention. As shown in FIG. 1, in the semiconductor integrated circuit production system, a chip data providing system 10 in an inspection enterprise (facility) and assembly enterprise systems at multiple assembly enterprises (facilities) including an assembly enterprise 20, an assembly enterprise 30 and the like are connected through the Internet 40.

The chip data providing system 10 is formed from a probe inspection device 11 that is used to test whether each chip formed in a semiconductor wafer is good or defective by using a probe, a probe inspection server 12 that stores chip data that shows the result of the probe inspection, a chip data providing server 13 that generates and stores chip data specific to each of the assembly enterprises based on the chip data that shows the result of the probe inspection, and a file transfer protocol server 14 (FTP server) that renders encryption processing to the chip data specific to each of the assembly enterprises, thereby generating encrypted chip data specific to each of the assembly enterprises, and stores them.

The probe inspection device 11 is connected with the probe inspection server 12, and the probe inspection server 12 and the chip data providing server 13 are mutually connected with each other through a network N11. Also, the FTP server 14 is connected with the probe inspection server 12 and the chip data providing server 13 through the network N11 and N12, and FW 15 (Fire Walls) to defend the system against unauthorized access, and is connected with a wide area network such as the Internet 40 through the network N12 and FW16.

Next, the chip data providing system is described in detail with reference to FIG. 2. The probe inspection device 11 measures a voltage value, a current value, or the like outputted by impressing a predetermined voltage to each of chips formed in a semiconductor wafer that is completed with pre-processing steps (processing steps), to thereby check the electrical characteristic of each of the chips. The check conducted by the probe inspection device 11 not only tests whether each chip is good or defective but also classifies the quality of the "good" chips based on the electric characteristic. Semiconductor wafers checked by the probe inspection device 11 are shipped to a plurality of assembly enterprises.

The probe inspection server 12 includes a probe inspection result collection section 12a where inspection results provided by the probe inspection device 11 are collected, a record section 12b where chip data are stored, and a data transfer processing section 12c that transfers the chip data recorded in the record section 12b to the chip data providing server 13 through the network N11.

The probe inspection result collection section 12a collects inspection results that each indicate the quality of each of the chips inspected by the probe inspection device 11, and records the inspection results in the record section 12b as chip data.

Figure 3:
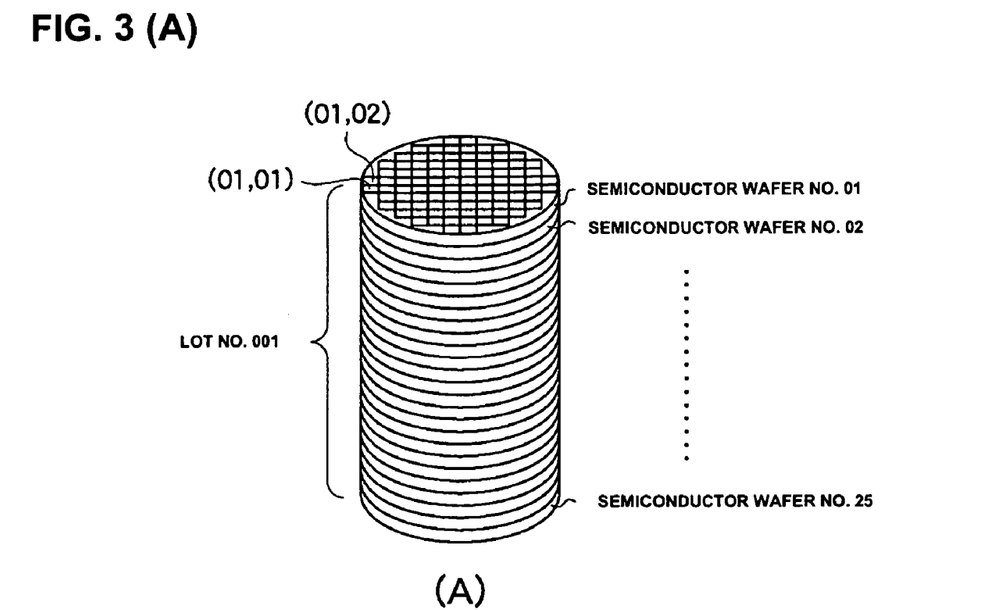

FIGS. 3(A) and (B) are figures for explaining the chip data. As shown in FIG. 3 (A), the chip data recorded in the record section 12b is in a format for which 25 semiconductor wafers are assumed to be in each lot, and each of the chips in each of the semiconductor wafers is specified by coordinates.

Therefore, as shown in FIG. 3 (B), the chip data is composed of model names that indicate the kinds of semiconductor integrated circuits on which chips are mounted, chip names that indicate the kinds of the chips, lot numbers, semiconductor wafer numbers, X coordinates and Y coordinates that indicate positions of the chips in each semiconductor wafer, and data that indicate categories each representing the quality of each of the chips. Also, the chip data may include the number of products of good quality. Further, the number of products of good quality can be composed as header information of the chip data for each lot. The data indicative of the category may be composed of data each indicating the rank of each of the chips, or may be composed of data each indicating a chip of good quality or a chip of defective quality when there are two kinds of quality, good quality and defective quality.

Referring back to FIG. 2, the data transfer processing section 12c reads the chip data recorded in the record section 12b, and transfers the read chip data to the chip data providing server 13 through the network N11.

The chip data providing server 13 includes a data load processing section 13a that loads chip data transmitted from the data transfer processing section 12c; a record section 13b that records the chip data loaded by the data load processing section 13a, and assembly enterprise specific model master and assembly enterprise specific chip data; an assembly enterprise specific chip data generation section 13c that generates chip data specific to each individual assembly enterprise based on the assembly enterprise specific model master recorded in the record section 13b; and a data transfer processing section 13d that transfers the chip data specific to each individual assembly enterprise recorded in the record section 13b to the FTP server 14 through the network N11 and N12, and FW15.

The data load processing section 13a loads the chip data transferred from the data transfer processing section 12c, and records the loaded chip data in the record section 13b. The record section 13b records the chip data loaded by the data load processing section 13a and the chip data specific to each individual assembly enterprise generated by the assembly enterprise specific chip data generation section 13c. Also, the record section 13b records the assembly enterprise specific model master that correlates the model names and the assembly enterprises.

Figure 4:
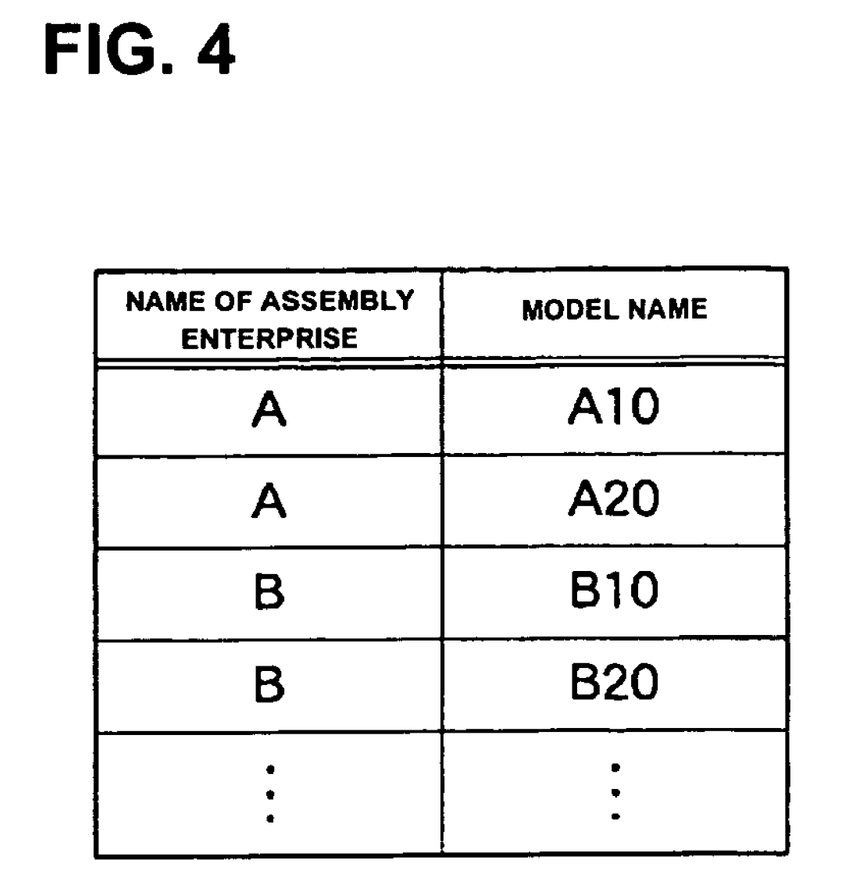
FIG. 4 is a diagram for explaining an assembly enterprise specific model master.

The assembly enterprise specific chip data generation section 13c classifies the chip data according to the assembly enterprises, and generates a plurality of assembly enterprise specific chip data based on the assembly enterprise specific model master. FIG. 4 is a figure for explaining the assembly enterprise specific model master. As shown in FIG. 4, the assembly enterprise specific model master is composed of names of assembly enterprises and model names. In the present embodiment, the assembly enterprise specific chip data generation section 13c detects the match between model names in the assembly enterprise specific model master and model names in the chip data, and classifies the chip data according to the assembly enterprises, thereby generating a plurality of assembly enterprise specific chip data.

For example, as shown in FIG. 4, when a model name "A10" and a model name "A20" correspond to an assembly enterprise name "A," data with the model name "A10," chip name "1," lot number "001," semiconductor wafer number "01," X coordinate "01," Y coordinate "01," and category "22" shown in the first line in FIG. 3 (B), and data with the model name "A20," chip name "1," lot number "001," semiconductor wafer number "01," X coordinate "01," Y coordinate "02," and category "05" shown in the second line in FIG. 3 (B) are both classified in the assembly enterprise name "A," and generated as assembly enterprise specific chip data including the assembly enterprise name "A." Similarly, as shown in FIG. 4, when a model name "B10" and a model name "B20" correspond to an assembly enterprise name "B," data corresponding to the model name "B10" shown in the sixth line of FIG. 3 (B), and data corresponding to the model name "B20" shown in the seventh line are classified in the assembly enterprise name "B," and generated as assembly enterprise specific chip data including the assembly enterprise name "B."

Figure 2:
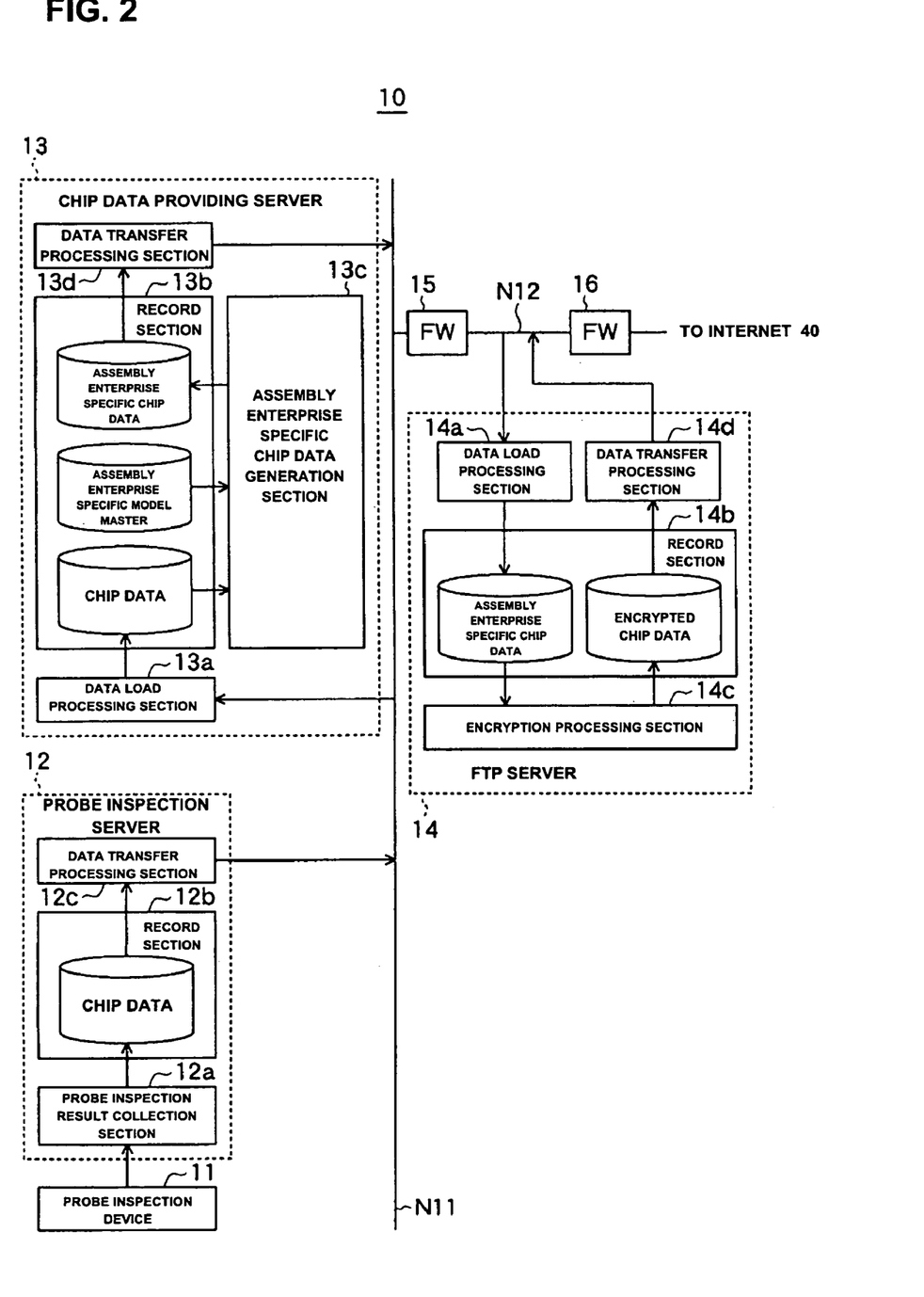
FIG. 2 is a diagram showing a detailed structure of a chip data providing system.

The assembly enterprise specific chip data generation section 13c shown in FIG. 2 generates chip data specific to each assembly enterprise in a format suitable for a chip data format that is used in the assembly enterprise system in each of the assembly enterprises. The data transfer processing section 13d reads a plurality of assembly enterprise specific chip data recorded in the record section 13b, and transfers the read assembly enterprise specific chip data to the FTP server 14 through the network N11 and N12, and FW15.

The FTP server 14 includes a data load processing section 14a that loads the assembly enterprise specific chip data transferred from the data transfer processing section 13d; a record section 14b that records the assembly enterprise specific chip data loaded by the data load processing section 14a and the encrypted chip data; an encryption processing section 14c that renders encryption processing to the assembly enterprise specific chip data recorded in the record section 14b, thereby generating encrypted chip data; and a data transfer processing section 14d that transfers the encrypted chip data recorded in the record section 14b to the Internet 40 through the network N12 and FW16.

The data load processing section 14a loads the plurality of assembly enterprise specific chip data transferred from the data transfer processing section 13d, and records the loaded assembly enterprise specific chip data in the record section 14b. The record section 14b records the plurality of assembly enterprise specific chip data loaded by the data processing section 14a, and the encrypted assembly enterprise specific chip data generated by the encryption processing section 14c.

The encryption processing section 14c renders encryption processing to each of the assembly enterprise specific chip data and generates encrypted chip data respectively to prevent the assembly enterprise specific chip data from leaking. The data transfer processing section 14d reads each of the encrypted chip data recorded in the record section 14b, and transfers the plurality of encrypted chip data read out to the corresponding assembly enterprise systems such as the assembly enterprise system 20 and the assembly enterprise system 30, respectively, through the network N12, FW16, and the Internet 40.

Referring back to FIG. 1, the assembly enterprise system 20 includes a FTP server 21 that renders decryption processing to the encrypted chip data, and stores the decrypted assembly enterprise specific chip data, and a chip selection system 22 that selects chips of good quality based on the decrypted assembly enterprise specific chip data. Here, the FTP server 21 is connected with the Internet 40 through the network N21 and the firewall 23, and the chip selection system 22 is connected with the FTP server 21 through the network N21 and N22, and the firewall 24. Also, the assembly enterprise system 30 has similar compositions.

Figure 5:
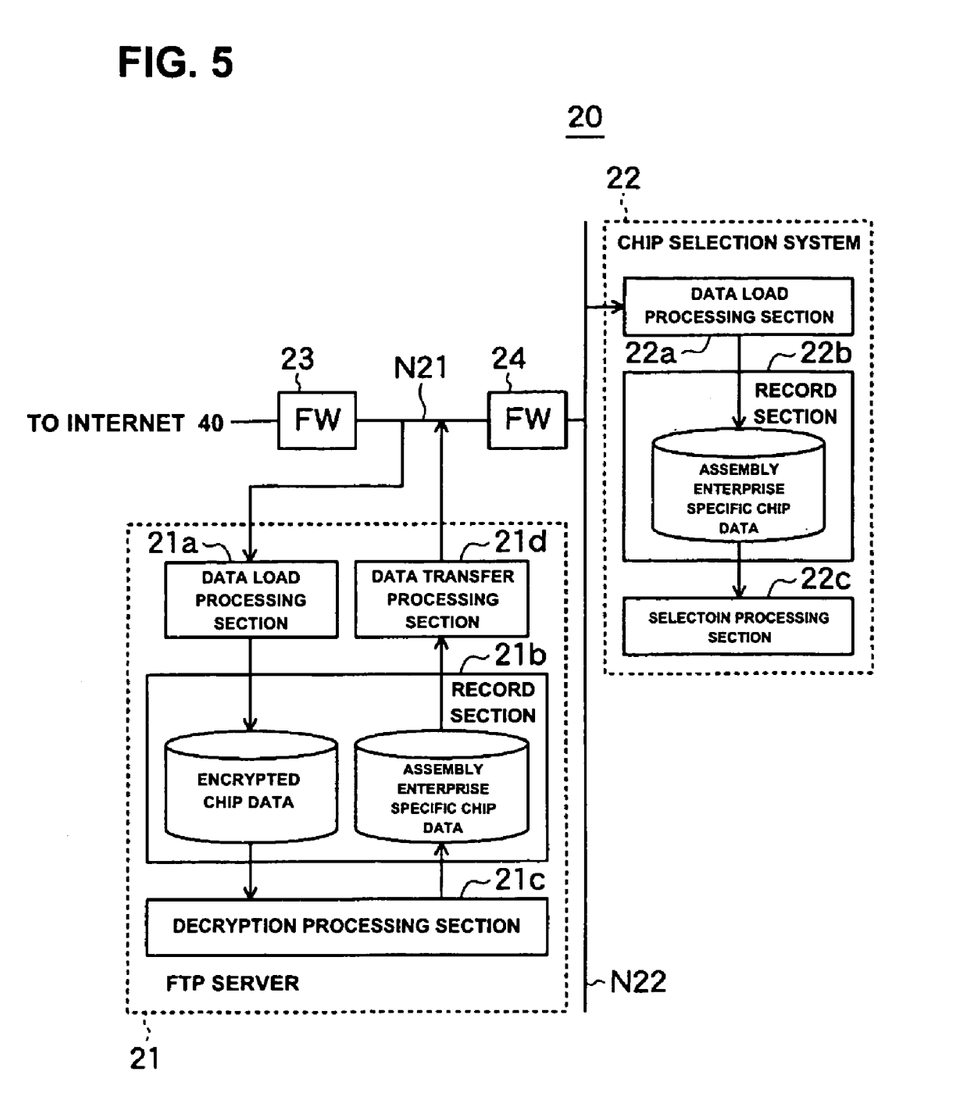
FIG. 5 is a diagram showing a detailed structure of an assembly enterprise system.

Next, referring to FIG. 5, the assembly enterprise systems are described in detail. It is noted that, although the assembly enterprise system 20 is described here, a similar description applies to the assembly enterprise system 30. The FTP server 21 includes a data load processing section 21a that loads the encrypted chip data for the assembly enterprise system 20 transferred from the chip data providing system 10 through the Internet 40, FW23, and the network N21; a record section 21b that records the encrypted chip data loaded by the data load processing section 21a, and assembly enterprise specific chip data; a decryption processing section 21c that renders decryption processing to the encrypted chip data recorded in the record section 21b, thereby decrypting the assembly enterprise specific chip data; and a data transfer processing section 21d that transfers the assembly enterprise specific chip data recorded in the record section 21b to the chip selection system 22 through the network N21 and N22, and FW24.

The data load processing section 21a loads the encrypted chip data for the assembly enterprise system 20 forwarded from the data transfer processing section 14d (FIG. 2) through the Internet 40, FW23, and the network N21, and records the loaded encrypted chip data in the record section 21b. The record section 21b records the encrypted chip data loaded by the data load processing section 21a, and the assembly enterprise specific chip data decrypted by the decryption processing section 21c.

The decryption processing section 21c renders decryption processing to the encrypted chip data that have been encrypted, thereby decrypting the assembly enterprise specific chip data, to prevent the assembly enterprise specific chip data from leaking. The data transfer processing section 21d reads the assembly enterprise specific chip data recorded in the record section 21b, and transfers the read assembly enterprise specific chip data to the chip selection system 22 through the network N21 and N22, and FW24.

Also, the chip selection system 22 includes a data load processing section 22a that loads the assembly enterprise specific chip data transferred from the data transfer processing section 21d; a record section 22b that records the assembly enterprise specific chip data loaded by the data load processing section 22a; a selection processing section 22c that selects chips of good quality based on the assembly enterprise specific chip data recorded in the record section 22b.

The data load processing section 22a loads the assembly enterprise specific chip data transferred from the data transfer processing section 21d, and records the loaded assembly enterprise specific chip data in the record section 22b. The selection processing section 22c judges, based on the assembly enterprise specific chip data recorded in the record section 22b, as to whether each of the chips is good or defective, or as to which rank each of the chips belongs to even when the chips are of good quality, manufactures a plurality of chips by cutting the semiconductor wafers delivered from the inspection enterprise, and selects chips of good quality from among them. The chips of good quality selected by the selection processing section 22c are used in the process of assembling semiconductor integrated circuits in the assembly enterprise.

According to the present embodiment, the cost and drying time to coat ink can be reduced by generating the chip data. Moreover, because the assembly enterprise specific chip data generation section 13c can generate the chip data in a format suitable for each assembly enterprise system, chips can be efficiently selected in the assembly enterprise. In addition, because the FTP server of the assembly enterprise system manages the chip data transmitted by the chip data providing system through the Internet, two or more operational personnel in charge can understand the same information, and therefore mistakes due to the complication of information can be eliminated.

The present invention can be used in a chip data providing system used where an inspection enterprise inspects chips, and provides chip data representative of the quality of each of the chips to indicate whether each of the chips is good or defective or the like to assembly enterprises that assemble semiconductor integrated circuits using the chips that have completed inspection, and in a chip data providing server used therefore.

What is claimed is:

1. A chip data providing system comprising:
    an inspection section that inspects each chip unit of a plurality of chip units included in a semiconductor wafer after completing a process for forming integrated circuits on the plurality of chip units;
    an inspection server that generates first chip data including information concerning an inspection result of each chip unit of the plurality of chip units provided by the inspection section; and
    a chip data providing server that generates second chip data in a format compatible with a system of an assembly enterprise that selects and uses the plurality of chip units included in the semiconductor wafer, the second chip data being generated based on the first chip data generated by the inspection server and information concerning the assembly enterprise stored in advance, and the chip data providing server providing the second chip data to the assembly enterprise.

2. A chip data providing system according to claim 1, wherein the chip data providing server generates the second chip data in formats compatible with systems of a plurality of different assembly enterprises, and classifies and manages the second chip data according to the plurality of assembly enterprises.

3. A chip data providing system according to claim 1, further comprising an encryption section that renders encryption processing to the second chip data generated by the chip data providing server.

4. A chip data providing system according to claim 1, wherein the chip data providing server provides the second chip data to a plurality of different assembly enterprises and generates second chip data in formats compatible with systems of each of the plurality of different assembly enterprises.

5. A chip data providing system according to claim 4, wherein the chip data providing server classifies the second chip data according to the each of the plurality of assembly enterprises and manages the second chip data according to each assembly enterprise of the plurality of enterprises.

6. A chip data providing server comprising:
    a data load section that loads first chip data including information concerning an inspection result of each of a plurality of chip units provided by an inspection conducted after forming integrated circuits in the plurality of chip units included in a semiconductor wafer;
    a first database that stores first chip data loaded by the data load section;
    a second database that stores information concerning an assembly enterprise that selects chip units from the plurality of chip units included in the semiconductor wafer;
    a data generation section that generates second chip data in a format compatible with a system of the assembly enterprise based on the first chip data stored in the first database and the information concerning the assembly enterprise stored in the second database; and
    a data transfer processing section that performs a process to transfer the second chip data generated by the data generation section.

7. A chip data providing server according to claim 6, wherein the data generation section generates the second chip data in formats suitable to systems of a plurality of assembly enterprises, and classifies and manages the second chip data according to the plurality of assembly enterprises.

8. A chip data providing server according to claim 6, wherein the data load section stores, in the first database, a model name on which each of the chips is mounted, a lot number and a wafer number concerning each of the chips, coordinates of the good chips, and the number of good chips, as the first chip data.

9. A chip data providing server according to claim 6, wherein the data generation section generates the name of the assembly enterprise, model names on which each of the chips is mounted, a lot number and a wafer number concerning each of the chips, coordinates of the good chips, and the number of good chips, as the second chip data.

10. A chip data providing server according to claim 8, wherein the second database stores relations between assembly enterprises and model names on which each of the chips is mounted.

11. A chip data providing system comprising:
    an inspection section that inspects a semiconductor wafer which includes a plurality of chip units, the inspection section generating an inspection result of each of the plurality of chip units;
    an inspection server that generates first chip data including the inspection result; and
    a chip data providing server that is able to generate second chip data in a plurality of formats,
    the plurality of formats including a first format and a second format, the second chip data in the first format being sent to a first system of a first enterprise that selects chip units from the plurality of chip units based on the second chip data, and the second chip data in the second format being sent to a second system of a second enterprise that selects chip units from the plurality of chip units based on the second chip data.

12. A chip data providing system comprising:

an inspection section that inspects a semiconductor wafer which includes a plurality of chip units, the inspection section generating an inspection result of each of the plurality of chip units;

an inspection server that generates first chip data including the inspection result; and a chip data providing server that is able to generate second chip data in a plurality of formats, the second chip data being in a first format for a first system of a first enterprise that selects chip units from the plurality of chip units based on the first chip data and information concerning the first system when the chip data providing server provides the second chip data to the first system, and the second chip data being in a second format for a second system of a second enterprise that selects chip units from the plurality of chip units included in the semiconductor wafer based on the first chip data and information concerning the second system when the chip data providing server provides the second chip data to the second system.

13. A chip data providing server comprising:

a data load section that loads first chip data including information that includes an inspection result of a semiconductor wafer corresponding to a plurality of chip units;

a first database that stores the loaded first chip data;

a second database that stores information of a first enterprise that selects chip units from the plurality of chip units and information concerning a second enterprise that selects chips from the plurality of chip units;

a data generation section that generates second chip data in a format for a first system of the first enterprise based on the first chip data and the information concerning the first enterprise in the second database when the first chip data includes information concerning the first enterprise and generates second chip data in a format for a second system of the second enterprise based on the first chip data and the information concerning the second enterprise in the second database when the first chip data includes information concerning the second enterprise; and a data transfer processing section that transfers the second chip data.

14. A chip data providing server according to claim 13, the second chip data including information of quality of each of the plurality of chip units and the information of quality indicating whether each of the plurality of chip units is a non-defective product or a defective product.

15. A chip data providing server according to claim 13, the second chip data including information of quality of each of the plurality of chip units and the information of quality indicating a rank of the plurality of chip units.

16. A chip data providing server according to claim 13, wherein the first chip data includes coordinates of good chip units and a number of good chip units.

17. A chip selection system comprising:

a data load processing section that loads second chip data;

a record section that stores the second chip data; and a selection processing section that selects a chip unit from a plurality of chip units;

the second chip data having a first format for a first system of a first enterprise based on first chip data and information concerning the first enterprise when the second chip data is used by the first system of the first enterprise, the second chip data having a second format for a second system of a second enterprise based on the first chip data and information concerning the second enterprise when the second chip data is used by the second system of the second enterprise, and the first chip data including information that includes an inspection result of semiconductor wafer corresponding to the plurality of chips.

* * * * *